(12) United States Patent
Ozkan et al.

(10) Patent No.: US 10,263,107 B2
(45) Date of Patent: Apr. 16, 2019

(54) STRAIN GATED TRANSISTORS AND METHOD

(71) Applicant: The Regents of the University of California, Oakland, CA (US)

(72) Inventors: Cengiz S Ozkan, San Diego, CA (US); Mihrimah Ozkan, San Diego, CA (US); Yu Chai, New York, NY (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 15/583,732

(22) Filed: May 1, 2017

(65) Prior Publication Data
US 2018/0315852 A1 Nov. 1, 2018

(51) Int. Cl.
*H01L 29/78* (2006.01)
*H01L 29/786* (2006.01)
(Continued)

(52) U.S. Cl.
CPC ........ *H01L 29/7843* (2013.01); *H01L 21/022* (2013.01); *H01L 21/0217* (2013.01); *H01L 21/0228* (2013.01); *H01L 21/02178* (2013.01); *H01L 21/02181* (2013.01); *H01L 21/02194* (2013.01); *H01L 21/02244* (2013.01); *H01L 21/02274* (2013.01); *H01L 21/02304* (2013.01); *H01L 21/02568* (2013.01); *H01L 21/465* (2013.01); *H01L 21/6835* (2013.01); *H01L 27/127* (2013.01); *H01L 27/1222* (2013.01); *H01L 29/24* (2013.01); *H01L 29/41733* (2013.01); *H01L 29/42356* (2013.01); *H01L 29/42364* (2013.01); *H01L 29/42384* (2013.01); *H01L 29/513* (2013.01); *H01L 29/517* (2013.01); *H01L 29/66969* (2013.01); *H01L 29/78603* (2013.01); *H01L 29/78618* (2013.01); *H01L 29/78648* (2013.01);
(Continued)

(58) Field of Classification Search
CPC .......... H01L 21/02274; H01L 21/0217; H01L 21/02181; H01L 21/02178; H01L 21/02194; H01L 21/022; H01L 21/02244; H01L 21/0228; H01L 21/02304; H01L 21/02568; H01L 21/4763; H01L 27/1222; H01L 27/127; H01L 51/0554; H01L 51/0558; H01L 51/0529; H01L 29/66969; H01L 29/78648; H01L 29/78696; H01L 29/78603; H01L 29/7843; H01L 29/513; H01L 29/41733; H01L 29/42356; H01L 29/78618; H01L 29/42384; H01L 29/517; H01L 29/43264
See application file for complete search history.

(56) References Cited

U.S. PATENT DOCUMENTS 6,573,172 B1 * 6/2003 En ..................... H01L 21/76832
257/E21.576
6,639,279 B1 * 10/2003 Sung ................... H01L 29/4908
257/288

(Continued)

*Primary Examiner* — Sophia Nguyen
(74) *Attorney, Agent, or Firm* — Schwegman Lundberg & Woessner, P.A.

(57) ABSTRACT

A strain gated transistor and associated methods are shown. In one example, a transistor channel region includes a metal dichalcogen layer that is stressed to improve electrical properties of the transistor.

13 Claims, 7 Drawing Sheets

(51) Int. Cl.

| | |
|---|---|
| *H01L 29/423* | (2006.01) |
| *H01L 29/417* | (2006.01) |
| *H01L 29/51* | (2006.01) |
| *H01L 29/66* | (2006.01) |
| *H01L 21/02* | (2006.01) |
| *H01L 21/683* | (2006.01) |
| *H01L 21/465* | (2006.01) |
| *H01L 29/24* | (2006.01) |
| *H01L 51/05* | (2006.01) |
| *H01L 27/12* | (2006.01) |
| *G03C 1/09* | (2006.01) |

(52) U.S. Cl.
CPC .... *H01L 29/78696* (2013.01); *H01L 51/0529* (2013.01); *H01L 51/0554* (2013.01); *H01L 51/0558* (2013.01); *G03C 2001/095* (2013.01); *H01L 2221/68363* (2013.01)

(56) References Cited

U.S. PATENT DOCUMENTS

| | | | | |
|---|---|---|---|---|
| 7,242,041 B2* | 7/2007 | Bucher | H01L 29/26 | 257/192 |
| 7,585,704 B2* | 9/2009 | Belyansky | C23C 16/345 | 438/131 |
| 7,943,491 B2* | 5/2011 | Nuzzo | B82Y 10/00 | 257/E21.122 |
| 8,766,330 B2* | 7/2014 | Paranjape | H01L 31/032 | 257/257 |
| 8,994,079 B2* | 3/2015 | Song | H01L 29/1606 | 257/288 |
| 9,306,028 B2* | 4/2016 | Chen | H01L 29/4908 | |
| 9,576,950 B1* | 2/2017 | Yeo | H01L 23/535 | |
| 2003/0103181 A1* | 6/2003 | Imayama | G02F 1/133345 | 349/122 |
| 2006/0046387 A1* | 3/2006 | Choi | H01L 21/28273 | 438/257 |
| 2006/0099765 A1* | 5/2006 | Yang | H01L 21/823807 | 438/301 |
| 2006/0172481 A1* | 8/2006 | Tsui | H01L 21/76825 | 438/199 |
| 2006/0246633 A1* | 11/2006 | Arai | H01L 29/4908 | 438/149 |
| 2006/0246738 A1* | 11/2006 | Isobe | H01L 27/12 | 438/769 |
| 2006/0270066 A1* | 11/2006 | Imahayashi | H01L 51/0541 | 438/4 |
| 2006/0284317 A1* | 12/2006 | Ito | H01L 21/76814 | 257/751 |
| 2007/0099360 A1* | 5/2007 | Lee | H01L 21/823807 | 438/197 |
| 2007/0105368 A1* | 5/2007 | Tsui | H01L 21/3105 | 438/624 |
| 2007/0210353 A1* | 9/2007 | Nagata | H01L 29/4908 | 257/288 |
| 2007/0254420 A1* | 11/2007 | Ajmera | H01L 21/823412 | 438/179 |
| 2007/0287240 A1* | 12/2007 | Chen | H01L 21/823807 | 438/197 |
| 2008/0020591 A1* | 1/2008 | Balseanu | C23C 16/345 | 438/761 |
| 2008/0124855 A1* | 5/2008 | Widodo | H01L 21/3105 | 438/199 |
| 2008/0145979 A1* | 6/2008 | Huang | H01L 29/66757 | 438/151 |
| 2008/0191281 A1* | 8/2008 | Chidambarrao | H01L 21/84 | 257/351 |
| 2008/0242077 A1* | 10/2008 | Clark | C23C 16/34 | 438/622 |
| 2008/0277732 A1* | 11/2008 | Shima | H01L 21/823807 | 257/368 |
| 2008/0280424 A1* | 11/2008 | Yamazaki | H01L 27/1266 | 438/480 |
| 2009/0220822 A1* | 9/2009 | Buehlmann | G11B 9/02 | 428/846 |
| 2009/0283922 A1* | 11/2009 | Rachmady | H01L 21/28247 | 257/788 |
| 2010/0244185 A1* | 9/2010 | Takafuji | H01L 21/76254 | 257/507 |
| 2010/0252800 A1* | 10/2010 | Chidambarrao | B82Y 10/00 | 257/9 |
| 2011/0001197 A1* | 1/2011 | Fukiage | C23C 16/30 | 257/408 |
| 2011/0248261 A1* | 10/2011 | Yamazaki | H01L 29/7869 | 257/43 |
| 2012/0146053 A1* | 6/2012 | Saitoh | H01L 29/66795 | 257/77 |
| 2012/0228671 A1* | 9/2012 | Wang | H01L 29/7843 | 257/192 |
| 2012/0261763 A1* | 10/2012 | Yin | H01L 21/823807 | 257/369 |
| 2012/0276718 A1* | 11/2012 | Cheng | H01L 29/1606 | 438/478 |
| 2012/0326126 A1* | 12/2012 | Chen | H01L 29/42384 | 257/29 |
| 2013/0168743 A1* | 7/2013 | Dove | H01L 21/28114 | 257/288 |
| 2013/0175632 A1* | 7/2013 | Cai | H01L 21/823814 | 257/369 |
| 2013/0189839 A1* | 7/2013 | Guillorn | H01L 21/823814 | 438/675 |
| 2013/0203214 A1* | 8/2013 | Isobe | H01L 21/0237 | 438/104 |
| 2013/0228751 A1* | 9/2013 | Gotsmann | B82Y 10/00 | 257/24 |
| 2013/0267077 A1* | 10/2013 | Hong | C23C 14/568 | 438/478 |
| 2014/0099793 A1* | 4/2014 | Sun | H01L 29/66795 | 438/700 |
| 2014/0138637 A1* | 5/2014 | Yang | H01L 27/1218 | 257/40 |
| 2014/0151687 A1* | 6/2014 | Yamazaki | H01L 29/66969 | 257/43 |
| 2014/0183453 A1* | 7/2014 | Kim | H01L 29/151 | 257/29 |
| 2014/0197459 A1* | 7/2014 | Kis | H01L 29/66742 | 257/194 |
| 2014/0252415 A1* | 9/2014 | Nayfeh | H01L 29/7789 | 257/194 |
| 2014/0308821 A1* | 10/2014 | Ando | H01L 21/02181 | 438/778 |
| 2014/0319452 A1* | 10/2014 | Seabaugh | H01L 29/1606 | 257/9 |
| 2014/0332814 A1* | 11/2014 | Peng | H01L 21/0262 | 257/49 |
| 2015/0060846 A1* | 3/2015 | Yamamoto | H01L 21/28194 | 257/43 |
| 2015/0221499 A1* | 8/2015 | Park | H01L 29/1606 | 257/29 |
| 2015/0236156 A1* | 8/2015 | Uejima | H01L 29/7843 | 257/288 |
| 2015/0280012 A1* | 10/2015 | Sato | H01L 29/78684 | 257/29 |
| 2015/0318401 A1* | 11/2015 | Duan | H01L 29/66742 | 250/200 |
| 2016/0013277 A1* | 1/2016 | Ho | H01L 29/24 | 257/29 |
| 2016/0027928 A1* | 1/2016 | Sato | H01L 29/78603 | 257/29 |
| 2016/0093689 A1* | 3/2016 | George | H01L 21/02381 | 257/76 |
| 2016/0190244 A1* | 6/2016 | Lee | H01L 29/778 | 257/29 |
| 2016/0254349 A1* | 9/2016 | Sun | H01L 29/66795 | 438/478 |
| 2016/0276488 A1* | 9/2016 | Yamazaki | H01L 29/7869 | |
| 2016/0308006 A1* | 10/2016 | Park | H01L 21/02381 | |
| 2016/0314968 A1* | 10/2016 | Kim | C09D 1/00 | |

(56) References Cited

U.S. PATENT DOCUMENTS

| | | |
|---|---|---|
| 2016/0315101 A1* | 10/2016 | Afzali-Ardakani ............................ H01L 27/1214 |
| 2017/0005197 A1* | 1/2017 | Xiao ................. H01L 29/66795 |
| 2017/0054004 A1* | 2/2017 | Cheng ............... H01L 29/66553 |
| 2017/0098661 A1* | 4/2017 | Rakshit ................... H01L 27/12 |
| 2017/0098717 A1* | 4/2017 | Yeh ..................... H01L 21/3065 |
| 2017/0110338 A1* | 4/2017 | Amani .................. H01L 21/465 |
| 2017/0117417 A1* | 4/2017 | Akinwande ....... H01L 29/66772 |
| 2017/0117493 A1* | 4/2017 | Engel .................. H01L 51/0545 |
| 2017/0125599 A1* | 5/2017 | Yao ................... H01L 21/02178 |
| 2017/0168327 A1* | 6/2017 | Han ......................... G02F 1/061 |
| 2017/0243759 A1* | 8/2017 | Jintyou ................. H01L 21/385 |
| 2017/0345944 A1* | 11/2017 | Lin ................... H01L 29/78696 |
| 2017/0358579 A1* | 12/2017 | Ando ............. H01L 21/823828 |
| 2018/0026422 A1* | 1/2018 | Cronin ................ H01S 5/02415 |
| 2018/0075956 A1* | 3/2018 | Li .............................. B81C 1/00 |
| 2018/0114839 A1* | 4/2018 | Wu ....................... H01L 29/045 |

* cited by examiner

STRAIN GATED TRANSISTORS AND METHOD

TECHNICAL FIELD

This invention relates to field effect transistors and methods. In one example, this invention relates to strain gated field effect transistors.

BACKGROUND

Improved conduction in semiconductors is desired. Specifically, improved performance in field effect transistors is desired.

BRIEF DESCRIPTION OF THE DRAWINGS

FIGS. 2A-2D show data of band gaps versus strain condition for semiconductor materials according to an example of the invention.

DETAILED DESCRIPTION

In the following detailed description, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, or logical changes, etc. may be made without departing from the scope of the present invention.

Silicon nitride stress capping layer is a technique for increasing electron mobility and drive currents in n-channel silicon MOSFETs. Herein, the strain induced by silicon nitride is firstly characterized through the changes in photoluminescence and Raman spectra of a bare bilayer $MoS_2$ (Molybdenum disulfide). To make an analogy of the strain-gated silicon MOSFET, strain is exerted to a bilayer $MoS_2$ field effect transistor (FET) through deposition of a silicon nitride stress liner that warps both the gate and the source-drain area. Helium plasma etched $MoS_2$ layers for edge contacts. Current on/off ratio and other performance metrics are measured and compared as the FETs evolve from back-gated, to top-gated and finally, to strain-gated configurations. While the indirect band gap of bilayer $MoS_2$ at 0% strain is 1.25 eV, the band gap decreases as the tensile strain increases on an average of ~100 meV per 1% tensile strain, and the decrease in band gap is mainly due to lowering the conduction band at K point. Comparing top- and strain-gated structures, we find a 58% increase in electron mobility and 46% increase in on-current magnitude, signalling a benign effect of tensile strain on the carrier transport properties of $MoS_2$.

INTRODUCTION

Strain is a critical ingredient in modern transistor scaling. For Intel process technologies, the electron mobility decreased from 400 to 120 $cm^2$/Vs when the industry migrated from 0.80 μm to 0.13 μm technology node due to the large vertical electric field. Strain engineering has proven an effective route for mobility enhancement by modifying the carrier effective mass and mean scattering time. For transistors with sub-100 nm gate length, strained silicon increased the saturated MOSFETs drive currents by 10-20% and mobility by >50%, and later ramped into high volume manufacturing on high performance microprocessors in the 90 nm logic technology. The electron and hole mobility of silicon responds differently to externally applied stress. Longitudinal tensile stress along transistor channel improves electron mobility but degrades hole mobility. p-MOSFET features a compressively strained SiGe film embedded in the source and drain regions. The mismatch in the SiGe to Si lattice causes the channel to be under a uniaxial compressive strain, leading to significantly improved hole mobility. For n-MOSFET, a post-salicide tensile silicon nitride capping layer was deposited on top of the transistor gate, wrapping both the gate and source drain area. As a tensile stressor inside the nitride film tends to shrink, the stressor on the source and drain pulls apart the ends of the transistor channel and mainly produce a longitudinal tensile strain in the n-MOSFET channel.

For three-dimensional semiconductor, the ultimate strain exertion is limited by both bulk defects and surface imperfections. Transition metal dichalcogenides (TMDCs) are more suitable for strain engineering for two reasons: negligible bulk defects because of a thickness of only a few atomic planes and a fully-terminated surface, eliminating fab processing steps that usually targeted at the passivation of dangling bonds. A breaking strain up to 11% for $MoS_2$ has been proved experimentally, whereas bulk silicon can be strained only 1.2% before fracture.

Theoretical studies have predicted that when an external tensile stress is applied, the electronic structure of monolayer $MoS_2$ undergoes a series of variations: first, a direct-to-indirect band gap transition when the lattice constant is just slightly lengthened; second, a more drastic semiconductor-to-metal transition when the lattice constant is increased by more than 9.8%. In particular, the tensile strain reduces the gap energy and the effective masses while the compressive strain enhances them. Majority of experimental demonstration of the strain effect on $MoS_2$ employs standard three-point or four-point bending apparatus together with micro-Raman facilities. Ultra-thin $MoS_2$ samples are firstly exfoliated and then clamped onto a bendable material such as polydimethylsiloxane (PDMS), SU8/polycarbonate, polyethylene terephthalate (PET) and poly (methyl methacrylate) (PMMA). Photoluminescence (PL) spectra are recorded at the moment when a mechanical strain is exerted. Similar findings from the aforementioned literature have been reported: a red shift of PL emission energy and decreased peak intensity under uniaxial tensile strain, conforming to the direct-to-indirect transition of the optical band gap as predicated by theoretical studies. The observation can be qualitatively understood as a result of reduced orbital overlap and hybridization due to weakened atomic bonds. In complementary to the above results, a blue shift of the PL peak and an increase of the emission intensity have been reported for biaxial compressive strain exerted to tri-layer $MoS_2$ through a piezoelectric substrate. At the device level, back-gated $MoS_2$ transistors on a flexible substrate measured in the stretched state shows a shift of the transfer curve toward lower back-gate voltages and an increase in electron current than the results measured in flat state.

In this paper, we explore on the concept of "strain-gated" $MoS_2$ MOSFET. Here, strain is exerted to $MoS_2$ channel through the deposition of a silicon nitride stress capping layer that covers the entire transistor active area, analogous to the industry-proven technique applied to the early generation of n-channel silicon transistors. To enhance the field-effect mobility, uniaxial tensile strain along the transistor channel is favored to be generated in order to reduce the band gap and electron effective mass. Current on/off ratio and other performance metrics are measured as the transistors evolve from back-gated, to top-gated and finally, strain-gated structure.

Results and Discussion

Figure 1:
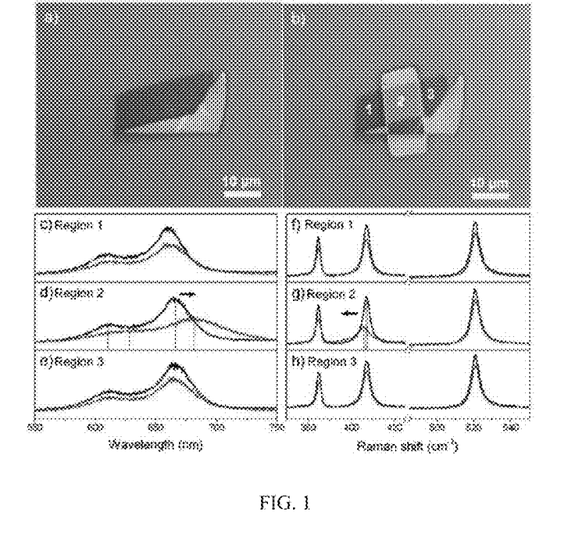
FIG. 1 shows characterization spectra of semiconductor materials according to an example of the invention.

First, we design sample structure to visualize the internal stress of the silicon nitride indirectly through the Raman mode shift of $MoS_2$ underneath. Silicon nitride ($SiN_x$) deposited by plasma-enhanced chemical vapor deposition (PECVD) are used in both Raman measurement and transistor characterization. As the ions do not respond to the field at a single RF frequency of 13.56 MHz, a thin film deposited under such conditions typically exhibits tensile stress. As shown in FIGS. 1 (a) and (b), a bi-layer $MoS_2$ sample was exfoliated and transferred onto a $Si/SiO_2$ substrate. The sample is divided into three regions: only region 2 is covered by 125 nm PECVD silicon nitride; the intact regions 1 and 3 serve as control groups. This is to minimize potential non-uniformities from different pristine bi-layer samples.

Before nitride deposition, the bi-layer thickness and the homogeneity of the $MoS_2$ sample are confirmed by PL and Raman measurement. In all three regions, PL spectra show the two prominent emission peaks at 670 and 627 nm (FIG. 1 c-e), corresponding to the two resonances known as A1 and B1 excitons, and the Raman spectra show a wavenumber difference of 22 $cm^{-1}$ between the $E_{2g}^1$ and $A_{1g}$ peak (FIG. 1 f-h), a signature of bi-layer $MoS_2$. To show the similarities in peak intensity among the three regions, the spectra taken from the as-prepared sample in FIG. 1 are re-plotted in overlapping format in FIG. S1

FIG. 1 shows photoluminescence and Raman spectra of bi-layer $MoS_2$ with locally deposited silicon nitride. (a) the as-prepared bi-layer $MoS_2$ on $Si/SiO_2$ substrate; (b) the same sample with only region 2 covered by silicon nitride, region 1 and 3 serve as control groups; (c to e) photoluminescence and (f to h) Raman spectra of all three regions, spectra in black color were taken from the as-prepared sample; red color, post-nitride deposition process. The black arrows indicate the direction of peak shift.

In the post-deposition PL spectrum of region 2 (FIG. 1d), we find ~10 nm red shift of the A1 excitons (from 670 to ~680 nm), and about 40% decrease of the emission intensity. The decrease in peak emission energy is ~27 meV by using E=1240/λ. The findings indicate a narrowed indirect bandgap possibly due to the tensile stress from the nitride capping layer. Difference in thermal expansion coefficient between $MoS_2$ and silicon nitride could be another source of stress. As the nitride layer was deposited at 120° C., a tensile strain can be induced in the $MoS_2$ flake during the subsequent cooling of the sample to room temperature. For the Raman spectra, given the fact that the referential peak of silicon remains at 520.7 $cm^{-1}$ before and after nitride deposition, the post-deposition spectrum of region 2 shows a red shift of the $A_{1g}$ peak ($\Delta\omega$=1.5 $cm^{-1}$), while the shift of $E_{2g}^1$ peak is negligible (FIG. 1g). We also observed this shift of $A_{1g}$ peak in other locations on the $MoS_2$ sample covered by the nitride slab, however no spatial correlations are concluded. The shift of the $A_{1g}$ peak also disappears once the laser crosses either left or right boundary of the nitride slab. This change in Raman spectra could be due to an extra strain in the out-of-plane direction, but we are still trying to identify the reason behind. Regarding Region 1 and 3, no noticeable peak shift was observed either in PL or Raman characterization, the slightly dropped intensity might originate from some resist reside adsorbed on the $MoS_2$ surface at the lift-off step.

Figure 2A:
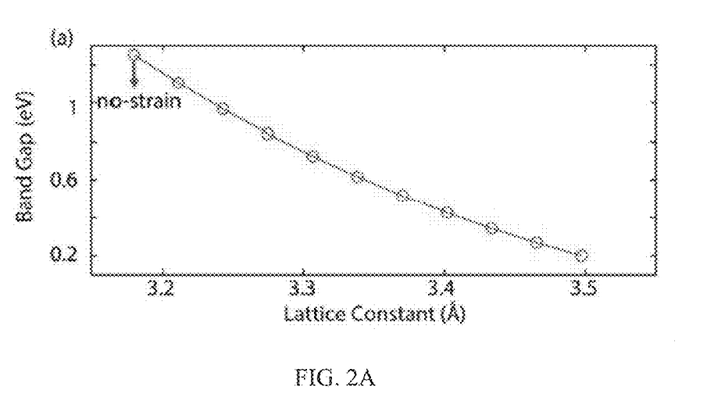
Figure 2B:
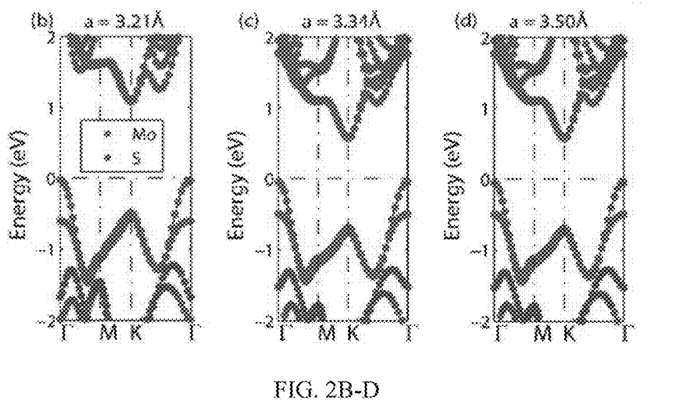

FIG. 2 shows strained bi-layer $MoS_2$ band structure calculation. (a) The continuously narrowed band gap of bilayer $MoS_2$ as a function of increasing lattice constant, the band structure with 1%, 5% and 10% tensile strain are shown in (b), (c) and (d). The blue and green dots in the figure represent Mo and S element occupation respectively.

The continuously narrowed band gap of bi-layer $MoS_2$ under tensile strain is calculated and shown in FIG. 2(a). The indirect band gap of bi-layer $MoS_2$ at 0% strain is 1.25 eV. It is clear that the band gap decreases as the tensile strain increases, the tunability on average is ~100 meV per 1% tensile strain. Beyond 10%, the bi-layer $MoS_2$ finally becomes close to metallic. Based on the simulated result, the magnitude of the tensile strain induced by the nitride capping layer is estimated to be much less than 1%. From the study of band structure in FIGS. 2 (b)-(d), the decrease in band gap is mainly coming from the lowering of the conduction band at K point. The band structure keeps indirect through all different tensile strain conditions. And the contribution of the band edge comes purely from Mo element's d-orbital.

Next, we design experiments to apply the nitride stress capping layer onto $MoS_2$ field-effect transistors and observe the strain's influence on device performance.

Figure 3A:
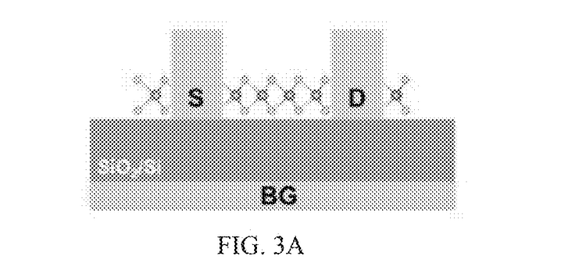
FIGS. 3A-3C show diagrams of some example transistor structures according to an example of the invention.
Figure 3B:
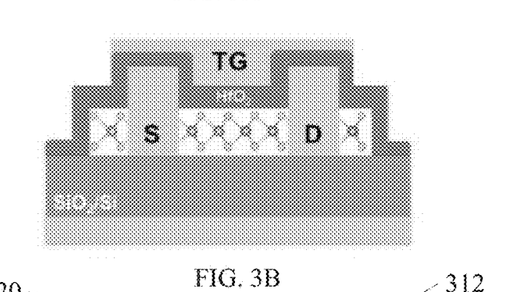
Figure 3C:
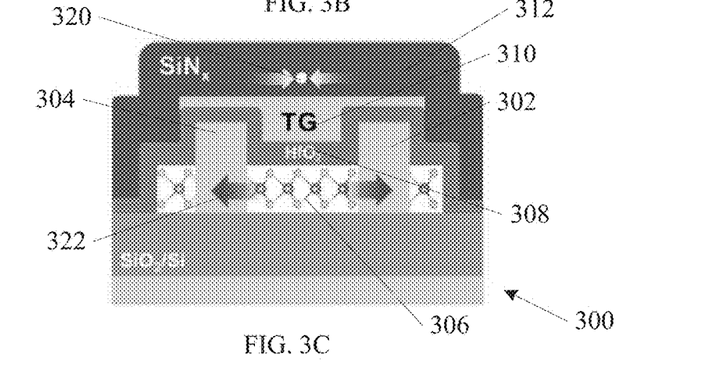

FIG. 3 shows the three main stages for electrical characterization: (a) back-gate; (b) top-gate and (c) strain-gate. As a tensile stressor inside the nitride film tends to shrink, the stressor on the source and drain pulls apart the ends of the transistor channel and mainly produce a longitudinal tensile strain in the MOSFET channel[2]. The sites for source drain contacts are engraved on the bi-layer $MoS_2$.

FIG. 3 shows the three main stages for electrical characterization, denoted as back-gate (BG), top-gate (TG) and strain-gate (SG). The key challenge for achieving the final strain-gate configuration is fabricating $MoS_2$ FETs with robust electrical contacts to endure multiple fab processing and electrical measurement cycles. From our experience, the yield of working FET and the performance repeatability are significantly improved with one-dimensional edge contacts, in contrast to conventional surface contacts which are affected by inherent surface defects found on natural $MoS_2$ crystal.

A semiconductor device 300 is shown in FIG. 3. In the example of FIG. 3, a single transistor is shown as an example. In other examples, the semiconductor device 300 includes multiple transistors configured to form a more complex semiconductor device 300, such as a memory device, or a processor, or other more complex semiconductor devices.

In the example of FIG. 3C, a first source/drain region 302 and a second source/drain region 304 are shown. A transition metal dichalcogenide channel region 306 is shown coupled between the first source/drain region 302 and the second source/drain region 304. A gate 310 is shown located over the channel region 306 and separated therefrom by a gate dielectric 308. A strain layer 312 is coupled to the semiconductor device 300. In the example shown, the strain layer 312 provides compressive stress 320 which in turn creates an axial tensile stress 322 in the channel region 306. Although an axial tensile stress 322 is illustrated in this example, other directions of stress may be induced in the channel region 306 without departing from the scope of the invention.

Figure 4:
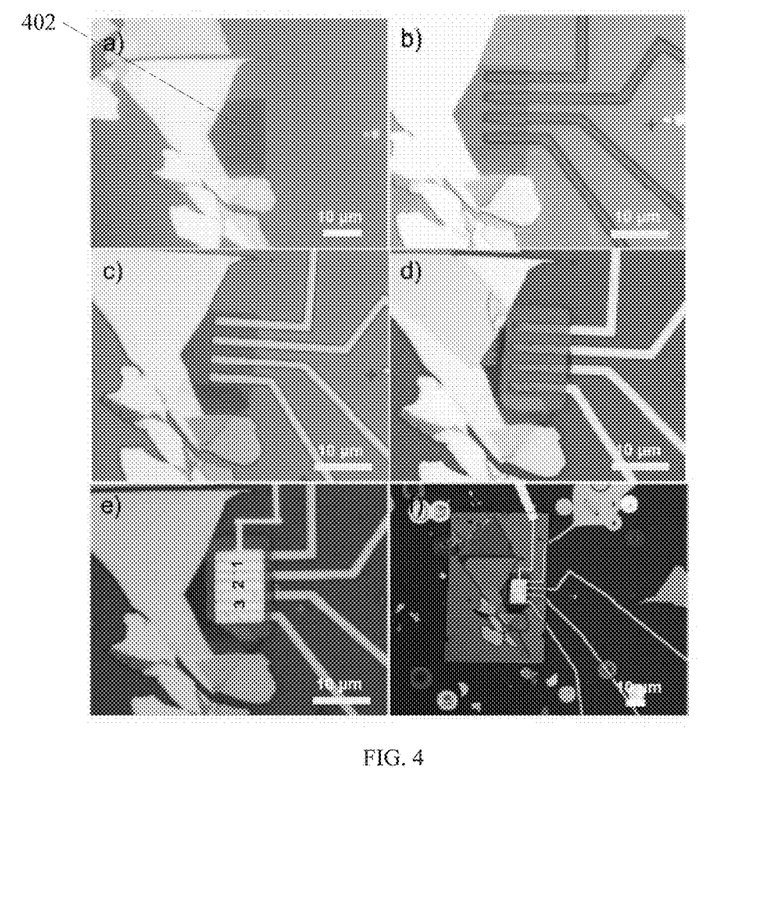
FIG. 4 shows photographs of some example transistor structures according to an example of the invention.

FIG. 4 shows the process flow for making strain-gated FETs (a) an optical image of a bi-layer MoS$_2$ in faint purple color on a Si/SiO$_2$ substrate; (b) the material exposed in source drain sites have been etched by helium plasma; (c) edge contact metal (Sc/Ni, 50/30 nm) evaporation and lift-off; (d) 30 nm HfO$_2$ ALD deposition (with 2 nm Al seed) and lift-off, for the bi-layer region only; (e) top-gate metal (Ti/Au, 10/60 nm) deposition, the FETs are labeled No. 1, 2 and 3; (f) 125 nm SiN$_x$ PECVD deposition at 120° C., capping both the multi-layer and the device area.

FIG. 4 shows the optical images captured at different stages of transistor fabrication. Firstly, MoS$_2$ flakes were directly exfoliated onto a Si/SiO$_2$ substrate and a bi-layer region 402 was identified (FIG. 4a). The thickness is confirmed by the 22 cm$^{-1}$ difference between the E$_{2g}^1$ and A$_{1g}$ modes and low wavenumber shear mode E$_g$ (20~25 cm$^{-1}$) (FIG. S2). After the first e-beam lithography step, the sites for source drain contacts were patterned and etched by helium plasma (FIG. 4b). Instead of using SF$_6$, helium plasma can prevent potential oxidation of the exposed MoS$_2$ atoms. The edge contacts are completed after metal evaporation (Sc/Ni) and lift-off (FIG. 4c). At the completion of the electrical measurement on the back-gate transistors, the bi-layer region is covered by a top-gate dielectric comprised of an AlO$_x$/HfO$_2$ stack (FIG. 4d). The AlO$_x$ layer, which helps to increase the nucleation sites for the atomic layer deposition of HfO$_2$, was formed by e-beam evaporation of 2 nm aluminum seeds, followed by its overnight natural oxidation in air. The MoS$_2$ transistors were sent for electrical measurement again after Ti/Au were deposited as the top-gate electrode (FIG. 4e). In the last lithography step, the entire MoS$_2$ flake, including both the multi-layer and device area, are sealed underneath the PECVD SiN$_x$ stress capping layer (FIG. 4f). The recipe was the same as the one used in the Raman characterization.

In total, three FETs are fabricated on this bi-layer MoS$_2$, as labeled on FIG. 4e. To test whether all three are functioning, the output and transfer characteristics were initially taken at the back-gate configuration (FIG. S3). The effective modulation of the drain current by VBG tells that all three edge-contacted FETs are working properly, though some non-linearity and discrepancy is still observed in the output plots, which could be due to the difference in contact resistance. In order to make a fair comparison across the three stages of fabrication, from this point on, the discussion is focused on the electrical performance of FET No. 2.

Figure 5:
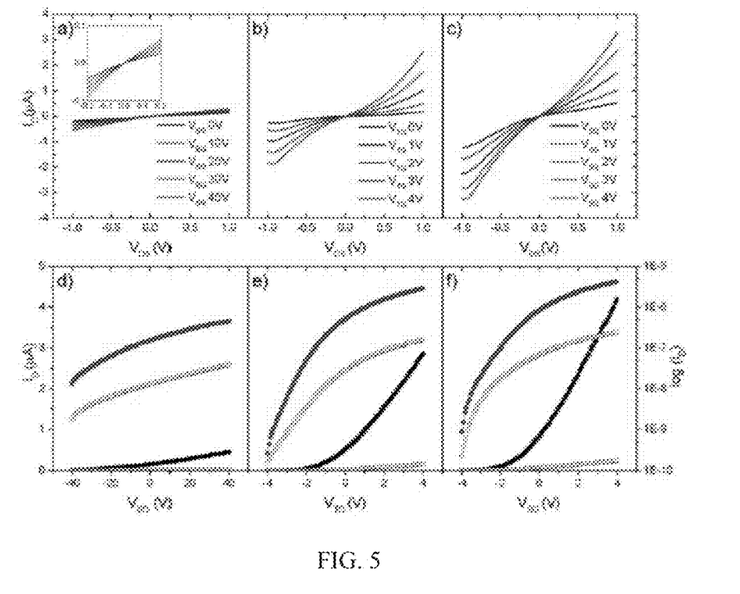
FIG. 5 shows electrical characterizations of some example transistor structures according to an example of the invention.

FIG. 5 shows electrical characterization of FET No. 2. Output plots (a to c) are in the first row, in which V$_{DS}$ is swept from −1 to 1V. The inset in (a) enlarges the area close to the origin. The names of the gate voltages tell which process the plot corresponds to: BG—back-gate, TG—top-gate, SG—strain gate. Gate transfer plots (d to f) are in the second row, with the linear axis on the left in black color and the log axis on the right in blue. The curves with filled markers correspond to a V$_{DS}$ bias of 1V; those with empty markers have V$_{DS}$ of 100 mV.

The full electrical characteristics of FET No. 2, comprising of results from back-gated, top-gated and strain-gated transistor structure, are given in FIG. 5. Output plots are shown in the first row, in which V$_{DS}$ is swept from −1 to 1V. The inset of FIG. 5(a) enlarges the area close to the origin. From −200 to 200 mV, I$_D$ changes almost linearly with V$_{DS}$, indicating an Ohmic-like junction. From FIG. 5(a) to (c), qualitatively, the spreading of the output curves along the vertical axis indicates continuously improved drain current and a more effective current modulation from the top-gated voltages. Of note is that the top-gate voltages were set to 10 times smaller than that for back-gate, for a much thinner top-gate dielectric and the enhanced over 60 times capacitance per unit area. As shown in the following equation, here we use 30 nm thick HfO$_2$ with a theoretical relative permittivity of $\varepsilon_r$=25, and 285 nm thick SiO$_2$ with $\varepsilon_r$=3.9:

$$C_{HfO2}/C_{SiO2} = \left(\frac{\varepsilon_{HfO_2}}{d_{HfO_2}}\right)\left(\frac{\varepsilon_{SiO_2}}{d_{SiO_2}}\right) = \left(\frac{25}{30 \text{ nm}}\right)\left(\frac{3.9}{285 \text{ nm}}\right) \approx 61 \quad (1)$$

Gate transfer plots are in the second row of FIG. 5. We notice three important results across all three transfer plots: 1) the drain current increases significantly at positive gate voltage, indicating n-type FET; 2) steep slopes of the transfer curves when we switch from back-gate to top-gate; owing to the much improved top-gate capacitance with HfO$_2$, the change in slope is later manifested as an evident decrease in sub-threshold swing; 3) the continued increase in drain current from top-gate to strain-gate, which proves that the deposition of the nitride stress liner indeed helps to enhance the transistor's electrical performance.

Figure 6:
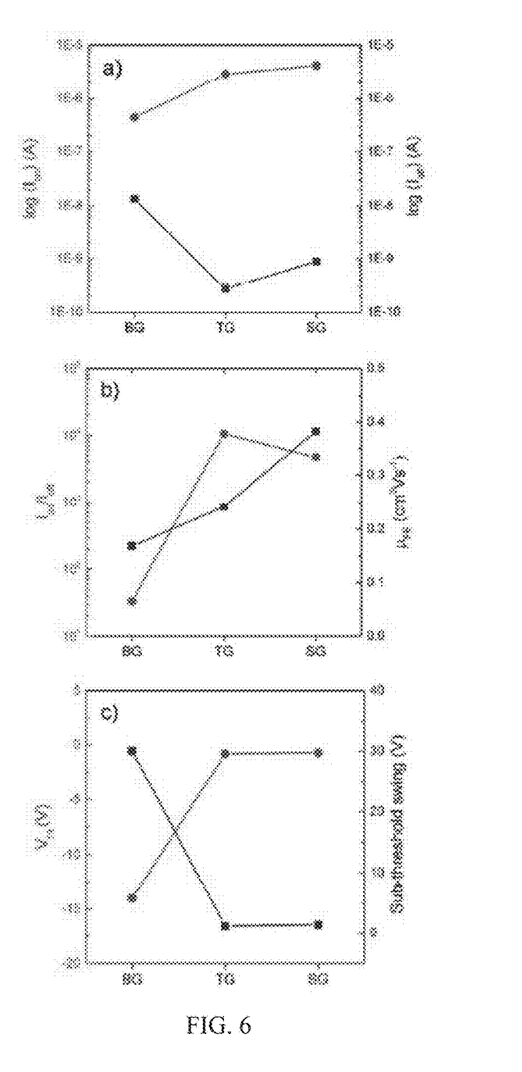
FIG. 6 shows carrier transport properties of some example transistor structures according to an example of the invention.

FIG. 6 shows a summary of the carrier transport properties of FET No. 2, encompassing the electrical characterization made at the three stages of device fabrication: back-gate, top-gate and strain-gate.

The extracted carrier transport parameters are plotted in FIG. 6. The "on" and "off" currents are defined as the maximum and the minimum currents in the measured gate voltage range. The mobility values were obtained firstly by curve fitting to each I$_D$-V$_{GS}$ curve and then calculated by applying the following equation:

$$\mu_{FE} = g_m \cdot (L/W) \cdot (1/C_{ox}) \cdot (1/V_{DS}) \quad (2)$$

where $C_{ox}$=1.2×10$^{-8}$ F/cm$^2$ is the capacitance per unit area of the 285 nm-thick SiO$_2$ back-gate dielectric, and $C_{ox}$=7.4×10$^{-7}$ F/cm$^2$ for 30 nm HfO$_2$ top-gate dielectric. The aspect ratio of transistor No. 2 is W/L=7.5/1.8 μm. Note that the maximum value of the transconductance $$g_m = dI_D/dV_{GS}$$

was used in the calculation. The data plotted in FIG. 6 were all obtained at V$_{DS}$=1V. From back- to top-gated FET, quantitatively, we notice a 5 times increase in on-current, ~98% decrease in off-current, significantly improved current on/off ratio from <100 to ~10$^4$, and a 43% increase in electron mobility. For the threshold voltage calculated using the linear extrapolation method, the value shrinks from −14 to −0.8 V; so does the sub-threshold swing, drops from 30 to 1.2 V. These improvements are most likely originated from the higher gate capacitance of the more insulative HfO$_2$ in the top-gate structure. From top- to strain-gated FET, we find another 58% increase in electron mobility and 46% increase in on-current magnitude, V$_{th}$ decreases slightly to −0.7V, and the sub-threshold swing remains relatively small at 1.4V. The consistancy in sub-threshold swing indicates that there is no change of the interface quality of the dielectric layer. Distinct piezotronic response of the MoS$_2$ was not observed, which is probably because of the opposite orientation of alternating layers in bi-layer 2H MoS$_2$. Flakes with even number of layers are expected to be centrosymmetric and non-piezoelectric. As the nitride PECVD deposition temperature is lower than that for contact annealing, we can conclude that the performance improvement is not due to a better contact, but a direct result from the strain effect induced by the nitride capping layer. Though the magnitude of the mobility is still too low for practical logic device, which is probably a result of the long span of time in multiple e-beam lithograpy steps and repetitive electrical characterizations in between, the ideas presented in this paper can be undoubtedly expanded to other TMDC semiconductor with high intrinsic mobilities. FET No. 3 exhibits similar carrier transport enhancement as FET No. 2, the extracted electron mobilities at the corresponding BG-TG-SG are 0.11, 0.13 and 0.20 cm$^2$/Vs, whereas no obvious performance improvement was observed in FET No. 1. It is possible that PECVD gives rough granulated SiN$_x$ surface at lower deposition temperature, leading to incoherent stress experienced by the bi-layer MoS$_2$ flake.

Figure 7:
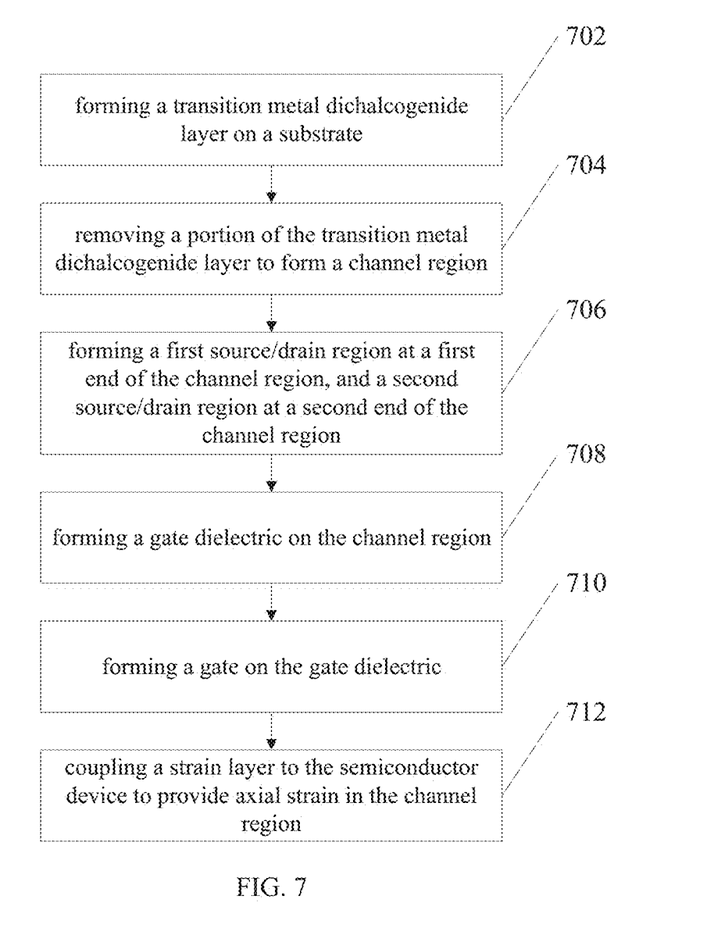
FIG. 7 shows a method of forming a material according to an example of the invention.

FIG. 7 shows one example of a method of forming a transistor as described in the present disclosure. In operation 702 a transition metal dichalcogenide layer is formed on a substrate. In operation 704, a portion of the transition metal dichalcogenide layer is removed to form a channel region. In operation 706, a first source/drain region is formed at a first end of the channel region, and a second source/drain region is formed at a second end of the channel region. In operation 708, a gate dielectric is formed on the channel region. In operation 710, a gate is formed on the gate dielectric. In operation 712, a strain layer is coupled to the semiconductor device to provide axial strain in the channel region.

In summary, we have characterized the strain induction in MoS$_2$ through both spectroscopic study and electrical measurement. We have also seen significant improvement in on-current density and mobility, when the FET evolves from back-gated, to top-gated and finally to strain-gated configuration. We conclude that the pioneering approach of strain induction through a nitride stress liner has a benign effect on improving the carrier transport property. It is also an industry-compatible and permanent solution for strain exertion without relying on external substrate bending facilities. Further studies of the strain effect in "all 2D" transistors with perceived greater flexibility would bring in deeper understanding of the tunibility of TMDCs' electrical properties under mechanical strain.

Methods

Bi-Layer MoS$_2$ Sample Preparation.

The bi-layer MoS$_2$ sample for spectroscopic study was initially exfoliated onto a PDMS-based gel-film, and then transferred onto a pre-cleaned oxidized Si substrate through an all-dry micro-manipulation procedure. This additional exfoliation step on gel-film significantly improved the yield of mono- and bi-layer MoS$_2$ to almost 100%. The freshly cleaved ultra-thin regions usually come in area of a few μm$^2$, feasible for multiple transistor fabrication. The second bi-layer MoS$_2$ sample used in strain-gated transistor fabrication was prepared following the conventional Scotch-tape based mechanical exfoliation using bulk crystal. Raman and photoluminescence spectra were acquired under ambient conditions with a Horiba LabRAM HR spectrometer equipped with a 523 nm laser supply and an 1800 lines/mm grating. A 100× objective was used for focusing the laser to an approximately 1 μm spot onto the sample. The laser power is <1 mW to prevent sample heating. Thin film thickness measurement was carried out under tapping mode from the AFM module of the spectrometer.

Strained Bi-Layer MoS$_2$ Band Structure Calculation.

The band dispersions and band gap energies of bilayer MoS$_2$ with and without strains were calculated using the Vienna ab initio simulation package (VASP) in the projected-augmented-wave method. The generalized gradient approximation (GGA) of the Perdew-Burke-Ernzerhof form is used for the exchange correlation energy. The vdW interactions between the two MoS$_2$ layers are accounted by using the DFT-D2 method of Grimme. The kinetic energy cutoff for our calculation is set as 500 eV. The lattice constant of bilayer MoS$_2$ without strain is about 3.179 Å. For all structural relaxations, the convergence tolerance on the Hellmann-Feynman forces is less than 0.01 eV/Å. An 8×8×1 Monkhorst-Pack k-point mesh is used for 2D films. The vacuum layer added to the system is nearly 20 Å. The other strained systems are all calculated under the same setting.

Edge Contacts and MoS$_2$ Transistors Fabrication.

A degenerately boron-doped (0.001~0.005 Ω·cm) silicon substrate with 285 nm SiO$_2$ capping layer, served as the global back gate and gate dielectric; silicon nitride PECVD deposition: Plasma-therm Unaxis 790, deposition pressure 900 mTorr, power 25 W, RF frequency 13.56 MHz, 2% SiN$_4$ 200 sccm, NH$_3$ 4 sccm, N$_2$ 900 sccm, deposition time 10 mins at 120° C., film thickness 125 nm; helium plasma for opening edge contacts: STS Reactive Ion Etcher Dielectric System, helium flow rate 50 sccm, 75 W, 20 s; HfO$_2$ ALD deposition: Cambridge Nanotech Savannah 100, 250 cycles at 120° C., film thickness 30 nm; Metal evaporation: Temescal BJD 1800 system, aluminum seed (2 nm, 0.1 Å/s), source drain electrodes (Sc/Ni, 50/30 nm), back-gate electrode (Ti/Au, 10/100 nm), top-gate electrode (Ti/Au, 10/60 nm); post-HfO$_2$ deposition contacts annealing: RTP-600S system, 200° C., Ar, 1 hour. The FETs were characterized in a shielded probe station connected to an Agilent 4155C semiconductor parameter analyzer. The entire measurement was carried out at room temperature in air.

While a number of advantages of embodiments described herein are listed above, the list is not exhaustive. Other advantages of embodiments described above will be apparent to one of ordinary skill in the art, having read the present disclosure. Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A semiconductor device, comprising:
   a transition metal dichalcogenide layer formed on a substrate, the transition metal dichalcogenide layer comprising a channel region, the channel region coupled between a first source/drain region and a second source/drain region;
   the first source/drain region and the second source/drain region penetrating within a thickness of the transition metal dichalcogenide layer;
   a top gate located adjacent to the channel region and separated therefrom by a conformal gate dielectric formed over the first source/drain region, the second source/drain region, the channel region, and a portion of the substrate that is not covered by the first source/drain region, the second source/drain region and the channel region; and
   a strain layer coupled adjacent to the channel region to provide a uniaxial tensile strain in the transition metal dichalcogenide channel region.

2. The semiconductor device of claim 1, wherein the transition metal dichalcogenide channel region includes molybdenum disulfide.

3. The semiconductor device of claim 1, wherein the transition metal dichalcogenide channel region includes a bilayer of transition metal dichalcogenide.

4. The semiconductor device of claim 1, wherein the strain layer includes silicon nitride.

5. The semiconductor device of claim 1, wherein the strain layer is coupled over the gate.

6. The semiconductor device of claim 1, wherein the first source/drain region, and the second source/drain region are coupled to the transition metal dichalcogenide channel region as edge contacts.

7. The semiconductor device of claim 1, wherein the conformal gate dielectric includes an aluminum oxide layer forming a direct interface with the transition metal dichalcogenide channel region.

8. The semiconductor device of claim 7, wherein the conformal gate dielectric includes a hafnium oxide layer forming a direct interface with the aluminum oxide layer.

9. A method of forming a semiconductor device, comprising:
   forming a transition metal dichalcogenide layer on a substrate;
   removing a portion of the transition metal dichalcogenide layer to form a channel region;
   forming a first source/drain region and a second source/drain region penetrating within a thickness of the transition metal dichalcogenide layer;
   forming a conformal gate dielectric over the first source/drain region, the second source/drain region, the channel region, and a portion of the substrate that is not covered by the first source/drain region, the second source/drain region and the channel region;
   forming a top gate on the conformal gate dielectric;
   coupling a strain layer adjacent to the channel region to provide a uniaxial tensile strain in the channel region.

10. The method of claim 9, wherein forming the transition metal dichalcogenide layer on the substrate includes exfoliating a layer of molybdenum disulfide and physically transferring the exfoliated layer of molybdenum disulfide to the substrate.

11. The method of claim 9, wherein coupling the strain layer to the semiconductor device includes plasma enhanced chemical vapor deposition of a silicon nitride layer.

12. The method of claim 9, wherein forming the first source/drain region, and the second source/drain region includes forming trenches in the transition metal dichalcogenide layer to expose edges and coupling the first source/drain region and the second source/drain region to the exposed edges.

13. The method of claim 12, wherein forming trenches in the transition metal dichalcogenide layer includes plasma etching the transition metal dichalcogenide layer.

* * * * *